US009252751B2

(12) United States Patent
Thakur et al.

(10) Patent No.: US 9,252,751 B2
(45) Date of Patent: Feb. 2, 2016

(54) APPARATUS AND METHOD FOR PREVENTING MULTIPLE RESETS

(71) Applicants: Nishant Singh Thakur, Indore (IN); Rakesh Pandey, Indirapuram (IN); Manmohan Rana, Indirapuram (IN)

(72) Inventors: Nishant Singh Thakur, Indore (IN); Rakesh Pandey, Indirapuram (IN); Manmohan Rana, Indirapuram (IN)

(73) Assignee: FREESCALE SEMICONDUCTOR, INC., Austin, TX (US)

(*) Notice: Subject to any disclaimer, the term of this patent is extended or adjusted under 35 U.S.C. 154(b) by 171 days.

(21) Appl. No.: 14/269,194

(22) Filed: May 4, 2014

(65) Prior Publication Data

US 2015/0318842 A1    Nov. 5, 2015

(51) Int. Cl.
H03K 3/02       (2006.01)
H03K 3/012      (2006.01)
G11C 16/28      (2006.01)
G11C 16/14      (2006.01)
G11C 17/16      (2006.01)
G11C 17/18      (2006.01)
H03K 3/037      (2006.01)
H03K 17/22      (2006.01)

(52) U.S. Cl.
CPC .............. *H03K 3/012* (2013.01); *G11C 16/14* (2013.01); *G11C 16/28* (2013.01); *G11C 17/16* (2013.01); *G11C 17/18* (2013.01); *H03K 3/0375* (2013.01); *H03K 17/22* (2013.01); *H03K 17/223* (2013.01)

(58) Field of Classification Search
None
See application file for complete search history.

(56) References Cited

U.S. PATENT DOCUMENTS

| 5,789,945 | A    | 8/1998  | Cline |
|-----------|------|---------|-------|
| 6,184,701 | B1   | 2/2001  | Kim |
| 6,384,619 | B1   | 5/2002  | Kim |
| 6,498,513 | B1   | 12/2002 | Reynolds |
| 6,727,839 | B2   | 4/2004  | Mulder et al. |
| 6,868,500 | B1   | 3/2005  | Kutz et al. |
| 7,738,310 | B2 * | 6/2010  | Naso ............... G11C 17/18 327/143 |
| 7,788,515 | B2 * | 8/2010  | Wong ............... G06F 1/26 327/198 |
| 8,330,517 | B1   | 12/2012 | Cline |
| 2008/0246509 | A1 | 10/2008 | Xiao et al. |
| 2009/0106609 | A1 | 4/2009  | Sato |
| 2010/0164469 | A1 | 7/2010  | Bansal |
| 2012/0126781 | A1 * | 5/2012  | Narayanan ...... G01R 31/3004 324/76.11 |

* cited by examiner

Primary Examiner — Tuan T Lam
(74) Attorney, Agent, or Firm — Charles E. Bergere

(57) ABSTRACT

Multiple resets in a system-on-chip (SOC) during boot where on-board regulators and low voltage detector circuits have different trimmed and untrimmed values may be avoided by the inclusion of a series of latches that latch the trimmed values during boot and retain the trim values even during a SOC reset event. The SOC is prevented from entering into a reset loop during boot or when exiting reset for any reason other than boot. A power-on-reset comparator circuit that does not depend on any trim values enables the latches and only clears the latched trim values if its own supply voltage falls below a preset level.

14 Claims, 2 Drawing Sheets

APPARATUS AND METHOD FOR PREVENTING MULTIPLE RESETS

BACKGROUND OF THE INVENTION

The present invention relates generally to integrated circuits such as system-on-chip (SOC) devices, and, more particularly, to a circuit and method for preventing multiple resets from occurring in such devices.

Power management units in a "System on Chip" (SOC) use Power-on Reset (POR) and Low Voltage Detector (LVD) techniques to initialize the SOC to a known state. When an SOC boots, many of its constituent parts, and particularly those comprising the power management circuits, work with default threshold values for LVD, POR and on-chip voltage regulator output voltages. During the boot procedure, trim values are loaded and default values of LVD POR, band gap reference (BGR) circuits and voltage regulators are changed. If the trimmed and untrimmed values of a given circuit are different, there is a possibility that the SOC will enter a loop of multiple resets for a short duration or even indefinitely. This behavior is undesirable, particularly if the SOC is used in safety-critical systems such as medical or automotive systems.

For example if an LVD has an untrimmed threshold of 1.15 v and a trimmed threshold of 1.18 v, then during boot, when the core voltage reaches 1.15 v, a LVD 'OK' is released and the trim values are loaded. However, as soon as the trim values are loaded, the LVD thresholds will change to 1.18 v, which will cause a reset of the SOC if the core voltage, which is still rising, has not yet reached 1.18 v. Once a reset is generated, the trim values will be deleted and the LVD will revert to the 1.15 v threshold value and assert an 'OK' status. Consequently, the SOC will again start loading trim values, leading again to a change of the LVD threshold from 1.15 v to 1.18 v and another reset cycle may follow. Depending on SOC implementation, this cyclical resetting behaviour can cause the on-chip voltage regulators also to be reset and hence an infinite cycle of reset can follow. Multiple resets increase boot time and may even cause hardware deadlock from which the system may not recover. For battery operated systems, if the SOC does not exit this loop, it will lead to the battery being drained.

Another problem can arise during booting owing to large variation of IR drop on bond wires and die power grid resistance, for example, which can result in a sudden dip in voltage, which is seen by the various on-board voltage monitoring circuits. This sudden dip can trigger one or more low voltage detectors resulting in the SOC being put into reset. Once in reset, the current suddenly drops, supply voltage is restored to a higher value and consequently the SOC exits reset and then goes back into reset again.

Therefore, it would be advantageous to prevent multiple reset events in integrated circuits.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
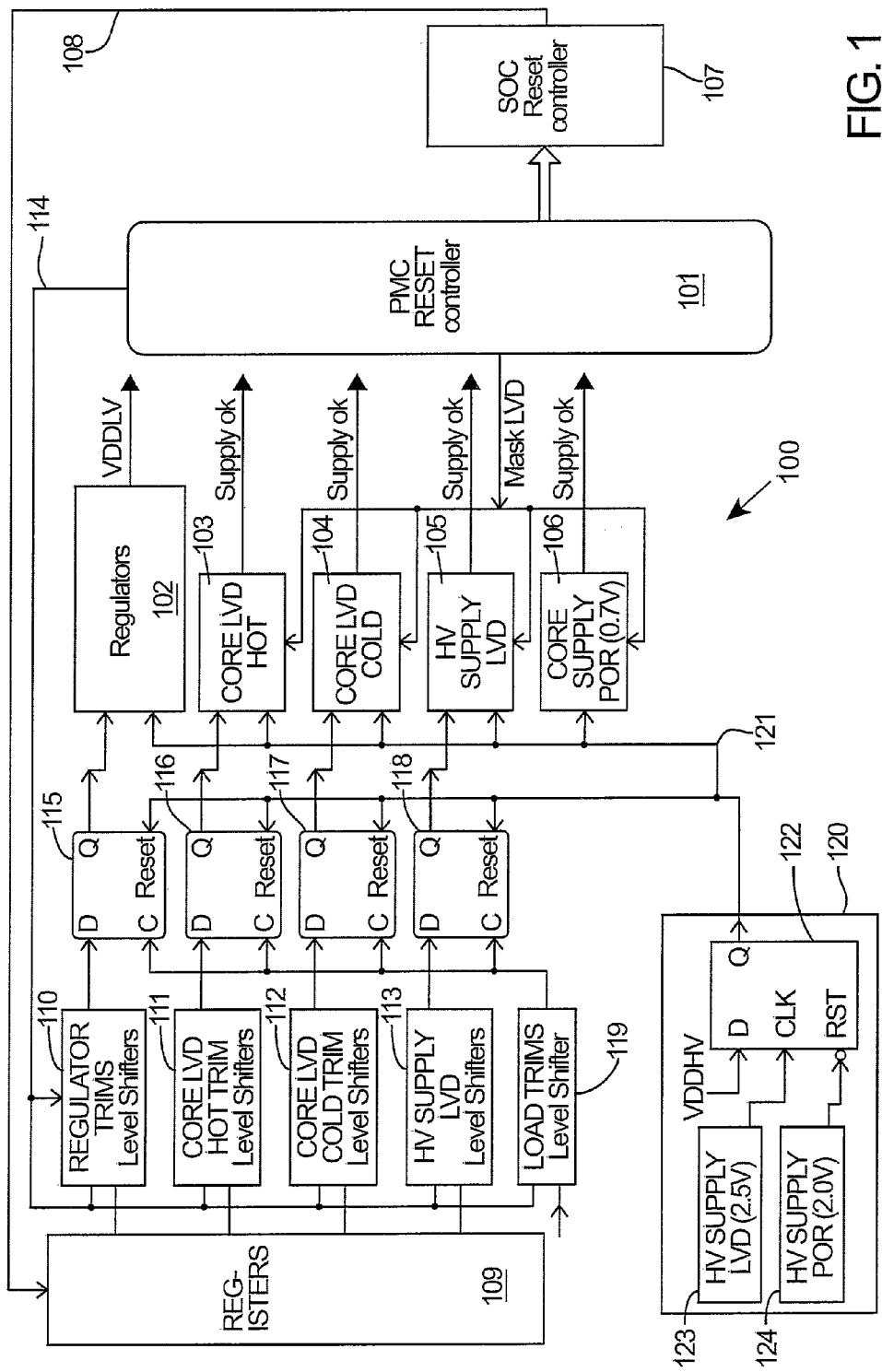
FIG. 1 is a simplified schematic block diagram of a system for preventing multiple resets in an integrated circuit device in accordance with an embodiment of the present invention.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides an apparatus for preventing multiple resets in an integrated circuit device. The apparatus comprises a voltage comparator for monitoring a supply voltage level and comparing the supply voltage level with a reference voltage level, generating an enable signal when the supply voltage level reaches a first reference voltage level, and generating a clear signal when the supply voltage level drops below a second reference voltage level. The apparatus also comprises a latch arrangement for latching at least one trim value and having a first input for receiving at least one trim value from the integrated circuit device, where a trim value relates to at least one of a voltage regulator and a low voltage detector, a second input for receiving a load trim value instruction from the integrated circuit device, a third input for receiving the enable and clear signals from the voltage comparator, and an output for connection to at least one of a voltage regulator and a low voltage detector. The latch arrangement latches and transfers to its output received trim values on receipt of the instruction and of a generated enable signal and to clear the latched values from its output on receipt of a clear signal.

Advantageously, once trim values have been loaded, they are not cleared from the latch arrangement even on reset of the integrated circuit or on tripping of a low voltage detector. The trim values are only cleared from the latch arrangement when the monitored voltage supply falls below a reference voltage. Thus, multiple resets of the integrated circuit can be avoided.

In one embodiment, the first reference voltage level is higher than the second voltage level and the enable and clear signals are also used to enable and disable a voltage regulator and/or low voltage detector included in the integrated circuit. Thus, as a safety measure for example, a regulator and low voltage detector can be enabled when a supply voltage reaches 2.5V, say, and disabled when the supply voltage drops to 2V.

In one embodiment, the latch arrangement comprises one or more master/slave flip flops with reset. Other types of flip flops may be employed in alternative embodiments.

In one embodiment, the comparator may include a master/slave flip-flop with reset and may act as a low voltage detector causing the flip-flop to latch when a monitored supply voltage reaches a first reference voltage level (of 2.5V for example) and as a Power-on-reset (POR) device, which causes the flip-flop to reset when a monitored supply voltage drops to a lower, second voltage level of 2V, for example).

In another embodiment, the present invention provides a method for preventing multiple resets in an integrated circuit device. The method comprises, in a power management controller of the integrated circuit device: monitoring a supply voltage level and comparing the supply voltage level with a reference voltage level; generating an enable signal when the supply voltage level reaches a first reference voltage level and generating a clear signal when the supply voltage level drops below a second reference voltage level; receiving a load trim value instruction, where a trim value relates to at least one of a voltage regulator and a low voltage detector; latching a trim value on receipt of the instruction and of a generated enable signal; and clearing the latched trim value on receipt of a clear signal when the supply voltage level falls below the second reference voltage.

Referring now to FIG. 1, a schematic block diagram of an integrated circuit in accordance with an embodiment of the present invention is shown. The integrated circuit includes an apparatus for preventing multiple resets from occurring in the integrated circuit. In this example, the integrated circuit is a system-on-chip SOC 100. A typical SOC comprises several functional blocks and at least one processing core. The functional blocks typically comprise analog to digital converters, memories, interfaces, and the like. For the sake of clarity and so as not to obfuscate the invention, not all these functional blocks are shown in FIG. 1.

A power management reset controller 101 receives a signal from each of at least one voltage regulator 102, a first low voltage detector 103 that monitors a core hot voltage level, a second low voltage detector 104 that monitors a least IR drop region voltage referred to as core cold voltage level, a third low voltage detector 105 that monitors a high voltage supply level and a fourth low voltage detector 106 that monitors a core supply power-on reset circuit supply voltage level. In other embodiments, different or additional low voltage detectors for monitoring voltage supplies for input/output interfaces or analog to digital converters for example can be included. The regulators and low voltage detectors are of conventional design. The regulator output signal received by the power management reset controller 101 comprises, in one example, a low voltage supply signal VDDLV. A typical value for VDDLV is between 1.13 and 1.18V.

Each of the low voltage detectors 103-106 is arranged to generate a "supply OK" signal on an output line thereof for reception by the power management reset controller 101 when the voltage that each low voltage detector monitors reaches a preset level. This preset level may be a trim value in the case of the first, second and third low voltage detectors 103-105 and a fixed level of 0.7V in the case of the fourth low voltage detector 106. A "mask low voltage detector" signal may be generated by and fed from the power management reset controller 101 to each of the first, second and third and fourth low voltage detectors 103-106 under certain operating conditions. Another output of the power management reset controller 101 is fed to an input of a SOC reset controller 107.

An output of the SOC reset controller 107 can be used to reset the SOC (under certain conditions) and to generate a "load trims" signal on line 108 for application to a set of registers 109.

The set of registers 109 hold trim bit values relating to trim vales of certain functional blocks of the SOC 100. The trim bit values are read from a fuse or flash memory (not shown). In this example, the trim values relate to the voltage regulator 102, a core hot trim for the first voltage detector 103, a core cold trim for the second low voltage detector 104 and a high voltage trim level for the third low voltage detector 105. Four level shifters 110-113 are operably coupled to the set of registers 109 and receive, respectively the trim bit values relating to the voltage regulator 102 and the three low voltage detectors 103-105. The level shifters 110-113 are of a conventional design serving to convert voltages in a high power supply domain to voltages in a low power supply domain and vice-versa. Typically, trim values appear at the inputs of the level shifters 110-113 when a "fuse load done" or "flash read done" signal is generated by the SOC 100. In one example, one or more of the level shifters 110-113 receives a "remove trim masking by enabling level shifters" signal on line 114, generated by the power management reset controller 101. This signal ensures that no trim values are loaded into the regulator 102 or first, second and third low voltage detectors 103-105 until the core supply voltage (as monitored by the fourth low voltage detector 106) is stable. A typical value for a core supply voltage is 1.2V.

Four latches 115-118 are operably coupled to outputs of each of the four level shifters 110-113, respectively. In this example, each of the four latches 115-118 is a master/slave latch with reset whose D input is coupled to a respective level shifter output for receiving a trim bit value. While four level shifters and four latches are shown in the figure, more than four of each may be used in other embodiments depending on the number of trim bits transferred from the set of registers 109. A clock input (C) of each of the four latches 110-113 receives a signal from a "load trims" level shifter 119 that, in turn, receives a "load trims" signal generated by the SOC 100. The "load trims" level shifter 119 also receives a reset gating signal on line 114 from the power management controller 101. In one example, trims are stored in fuses or FLASH and when these trims are read from either the fuse bank or FLASH, an indicator is generated indicating that the trims have been read. This indicator signal can be used as "load_trims" signal for the clock inputs of the latches 115-118. Preferably, all of the trims are loaded in synchronism. The Q outputs of each latch 113-118 are coupled, respectively, to an input of the regulator 102 and the first, second and third low voltage detectors 103-105. So, for example, when the "load trims" signal generated by the SOC 100 goes high, the trim bits at the D inputs of each of the latches 115-118 are latched and transferred to the Q outputs and thence to the regulator 102 and the low voltage detectors 103-105.

A comparator circuit 120 has an output on line 121 that is connected to a reset input of each of the latches 115-118 and to an enable/disable input of each of the regulator 104 and the four low voltage detectors 103-106. The comparator circuit 120 and all of the other modules shown in FIG. 1 receive a high voltage supply VDDHV. A typical value for VDDHV is between 2.7V and 3.3V. In one example, the comparator circuit 120 comprises a master/slave flip-flop 122 with reset having a D input connected to the voltage supply VDDHV. A clock input of the master/slave flip-flop 122 is connected to a HV supply low voltage detector 123 (for monitoring VDDHV). A reset input of the master/slave flip flop 122 is connected to a power-on-reset low voltage detector 124 (also for monitoring VDDHV). In one example, the HV supply low voltage detector 123 is arranged to trip at a particular voltage, e.g., 2.5 v, and the power-on-reset low voltage detector 124 is arranged to trip at a lower voltage, e.g., 2V. (Other voltages are possible in other examples). In this example, the comparator circuit 120 outputs an enable signal to the regulator 102 and to the first, second, third and fourth low voltage detectors 103-106 when VDDHV reaches 2.5V and outputs a disable signal if VDDHV drop below 2V. Similarly, when VDDHV drops below 2V, the latches 115-118 are kept in reset. When VDDHV rises above 2.5V, the resets to the latches 115-118 are disabled and the latches 115-118 will transfer the trim values on their D inputs to their Q outputs when their clocks toggle.

Any signal generated by the power management reset controller 101 or the SOC reset controller 107 that may result in resetting the SOC 100, clearing the trim values from the level shifters 110-113 or disabling the regulator 102 or low voltage detectors 103-106 will not affect the latches 115-118, which will retain the previously-loaded trim values.

The SOC 100 can load and latch trim bits of various functional blocks whose pre-trim and post-trim behaviour can cause an SOC boot to get into a reset cycle or any corrupt state. The comparator circuit 120, which can be set with a relatively low trip point and always works on untrimmed values, is used to keep the latches 115-118 in a reset state until the supply voltage reaches a preset level. As soon as the supply voltage reaches a level that is sufficient for logic operation and the trim values have been read into the set of registers 109, they are latched by the latches 115-118 and held on the Q outputs until the comparator circuit 120 output is reset. Since the comparator circuit 120 does not depend on trims, multiple SOC reset events will not occur as long as the supply voltage is enough to hold a valid logic state but not enough to perform fast logic operations at high frequency, for example. Note that neither the SOC 100 nor a power management controller included in the SOC is reset if the power-on-reset low voltage detector 124 trips. This means that any drop in VDDHV during a boot process will not cause any harm to the low voltage detector 124. The trip level of the low voltage detector 124 is kept comparatively low so that any "IR" drop is unlikely to cause VDDHV to drop from a typical 3.3 to 2V.

In an example of operation, when the SOC 100 boots for the first time with an untrimmed value of 1.15 v say, an LVD "ok" is asserted. Now trims are loaded and latched, as soon as trims are latched the LVD threshold goes to 1.18 v, say. If the core supply is not at 1.18 v then the SOC 100 will go into reset. However, in contrast with known systems, the LVD threshold will not go back to 1.15 v and the SOC 100 will remain in reset until supply increases above 1.18 v. Hence, when the SOC 100 is reset due to a difference in untrimmed and trimmed values, the latched values are retained thus preventing reset loops from occurring. When a further signal indicating that completion of fuse read is received, for example, received trims are latched again. Furthermore, if core supply voltage (1.2V say) is removed, latched trim values are unaffected. When the core supply is restored and the fuses are read again, the latches 115-118 capture the same trim values again when the signal indicating completion of fuse/read goes high. Therefore, no changes in trim values are seen by the voltage regulator 102 or low voltage detectors 103-106 so leading to stable voltage conditions.

While in the above example, the trip value of the power-on-reset low voltage comparator 124 is 2 v, this may be higher or lower depending on how any power management unit included in the SOC 100 is designed and under what conditions a user may wish to have such a power management unit turned off in cases of VDDHV power failure.

A reference voltage supplied to the power-on-reset low voltage detector 124 can be supplied from an on-chip Band Gap Regulator (BGR) (not shown) or indeed any other reference voltage derived from a supply. A BGR (trimmed or untrimmed) can also be used for supplying the reference voltage to the HV supply low voltage detector 123. If a trimmed BGR is used for this purpose, although the HV supply low voltage detector 123 will boot with an untrimmed value and then move to a (higher) trimmed value when the trims are loaded, when it trips when moving to the higher threshold, this will not lead to multiple resets because tripping of this particular low voltage detector is not normally a cause of SOC reset.

Figure 2:
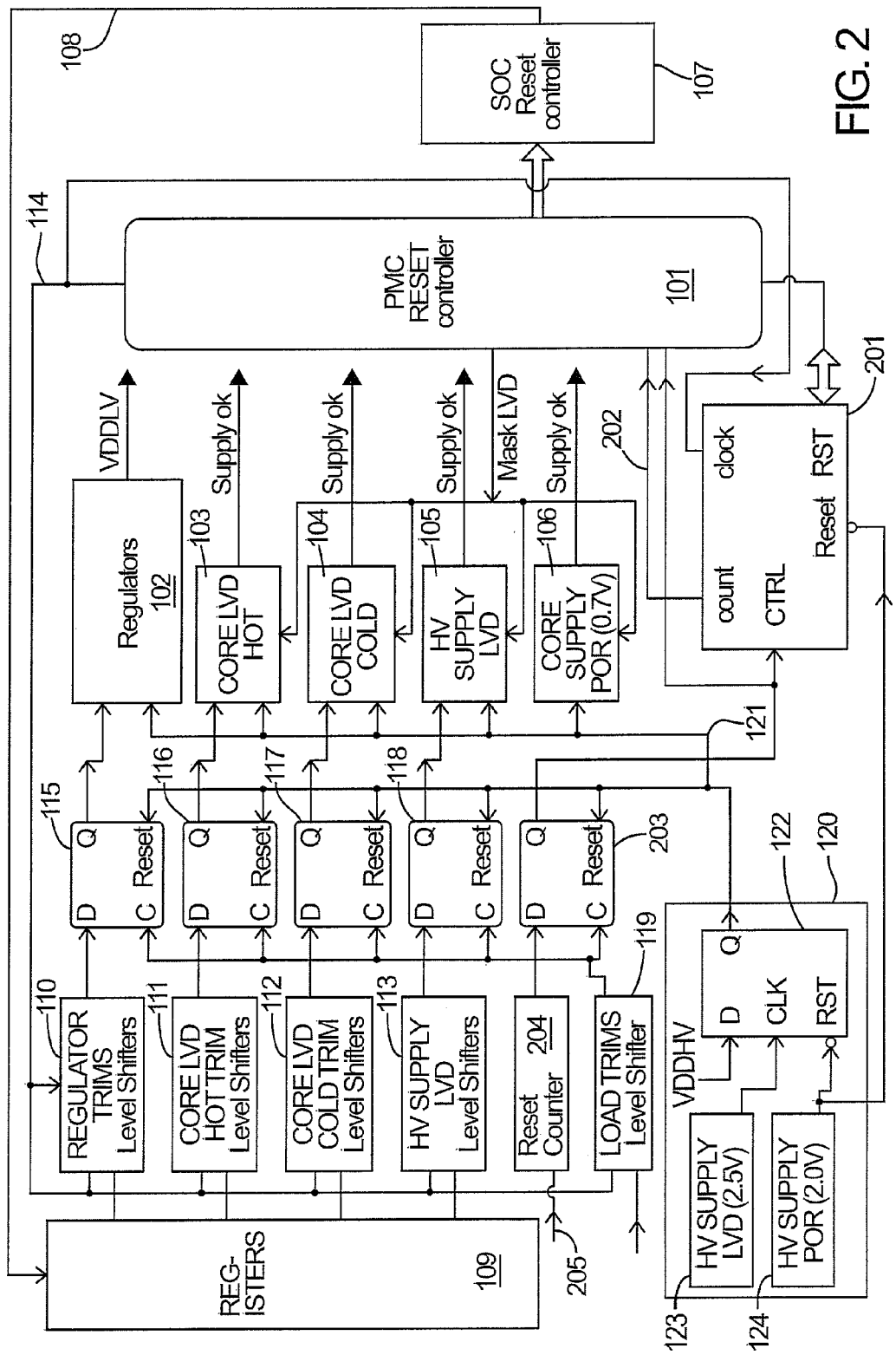
FIG. 2 is a simplified schematic block diagram of a system for preventing multiple resets in an integrated circuit device in accordance with another embodiment of the present invention.

Referring now to FIG. 2, a second example of a system for preventing multiple resets in a SOC is shown as a simplified, schematic block diagram with like components of FIG. 1 bearing the same reference numerals. This embodiment permits counting of the number reset signals generated by the power management reset controller 101.

A counter 201 has a clock input coupled to output line 114 of the power management reset controller 101. The counter 201 and the power management reset controller 101 are also coupled to one another via a reset (RST) input/output of the counter 201. A "count" output signal on line 202 is fed from the counter 201 to the power management reset controller 101. A reset input of the counter 201 is coupled to the output of the power-on-reset low voltage detector 124. A control input of the counter 201 is coupled to a Q output of a fifth latch 203. The Q output of the fifth latch 203 is also coupled to the power management reset controller 101. The fifth latch 203 in this embodiment is a master/slave latch with reset. The fifth latch 203 has a reset input that is connected to the output line 121 of the comparator circuit 120. The fifth latch 203 receives, at its clock input, the "load trims" signal on line 119. The fifth latch 203 receives, at its D input, a signal from a reset counter control bits module 204, which receives control bits from the SOC 100 on a line 205.

The counter 201 is arranged to keep a count of how many times the core of the SOC is reset. The counter 201 can be reset by software in some embodiments. The counter 201 has an output count value (X, say) and can be allocated a maximum permitted count value, (R_COUNT). The counter 201 can work with a hard-coded count value or alternatively can be arranged to receive a count value of a maximum number of allowed resets. A maximum number of allowed resets may be supplied by the SOC via the reset counter control bits module 204 and latched by the fifth latch 203 in a similar fashion to the latched trim bits as described with reference to FIG. 1. Once the programmed R_COUNT value is reached, the power management reset controller 101 determines whether the SOC 100 should boot or not, depending on the control bits it has received, through fuse or flash or through hard coding. If the SOC 100 recovers and successfully comes out of reset after X failed attempts then the counter 201 will be at X and it can be left up to software programming of the SOC to decide whether the counter 201 should be reset to zero or left as is.

As an example of how software can decide that the SOC 100 is successfully out of reset, once a particular TIME_OUT is reached and the counted value X is lower than R_COUNT the counter is reset to zero. This means that if, for example, for 100 ms if the counter's count X is lower than R_COUNT it is assumed that the SOC 100 has successfully booted and so the counter is zeroed. Otherwise the SOC 100 is kept in reset until the POR low voltage detector 124 trips and causes the counter to be reset to zero. A TIME_OUT counter can be located in a digital circuit module running off a crystal oscillator IRC or crystal because if such a digital TIME_OUT counter expired successfully without resetting, then this means that the SOC 100 has been out of reset for a reasonable amount of time.

The SOC of FIG. 1 may be operated in a test (or debugging) mode using trim registers such as the set of registers 109. The set of registers 109 permit, in one test mode, bypassing of the trim values held in fuses or flash memory. Trims for test purposes can be conveniently written into the trim registers using a CPU (central processing unit) or other test control interfaces. Further instructions can be written so that the latches 115-118 capture the trim values that are held in the trim registers. In another test mode of operation, latched trims and unlatched trims are multiplexed in the HV domain in a power management controller and instructions are written to the power management controller for selecting between untrimmed and trimmed values. Latched trims are bypassed in this test/debug mode The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device, such as a system on chip device. Such an integrated circuit may be a package containing one or more dies. For example, an integrated circuit device may comprise one or more dies in a single package with electronic components provided on the dies that form the modules and which are connectable to other components outside the package through suitable connections such as pins of the package and bond wires between the pins and the dies.

Also for example, the examples, or portions thereof, may implemented as soft or code representations of physical circuitry or of logical representations convertible into physical circuitry, such as in a hardware description language of any appropriate type.

Also the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. An apparatus for preventing multiple resets in an integrated circuit device, the apparatus comprising:
   a voltage comparator for monitoring a supply voltage level and comparing said supply voltage level with a reference voltage level, generating an enable signal when the supply voltage level reaches a first reference voltage level, and generating a clear signal when the supply voltage level drops below a second reference voltage level;
   a latch arrangement for latching at least one trim value and having a first input for receiving at least one trim value from the integrated circuit device, wherein a trim value relates to at least one of a voltage regulator and a low voltage detector, a second input for receiving a load trim value instruction from the integrated circuit device, a third input for receiving the enable and clear signals from the voltage comparator, and an output for connection to at least one of a voltage regulator and low voltage detector,
   wherein the latch arrangement latches and transfers received trim values to its output upon receipt of said instruction and of a generated enable signal, and clears the latched values from its output upon receipt of a clear signal.

2. The apparatus of claim 1, wherein the latch arrangement comprises a master/slave flip-flop with reset.

3. An integrated circuit including an apparatus for preventing multiple resets in said integrated circuit, the apparatus comprising:
   a voltage comparator for monitoring a supply voltage level and comparing said supply voltage level with a reference voltage level, generating an enable signal when the supply voltage level reaches a first reference voltage level, and generating a clear signal when the supply voltage level drops below a second reference voltage level; and
   a latch arrangement for latching at least one trim value and having a first input for receiving at least one trim value from the integrated circuit device wherein a trim value relates to at least one of a voltage regulator and a low voltage detector, a second input for receiving a load trim value instruction from the integrated circuit, a third input for receiving the enable and clear signals from the voltage comparator and an output for connection to at least one of a voltage regulator and low voltage detector, wherein the latch arrangement latches and transfers received trim values to its output upon receipt of said instruction and of a generated enable signal, and clears the latched values from its output on receipt of a clear signal.

4. The integrated circuit of claim 3, wherein the integrated circuit is a system-on-chip.

5. The integrated circuit of claim 3, further comprising at least one of a voltage regulator and a low voltage detector and wherein the output of the voltage comparator is coupled to an enable/disable input of said at least one of a voltage regulator and a low voltage detector.

6. The integrated circuit of claim 3, further comprising a low voltage detector arranged to receive trim values from the latch arrangement, and a reset controller arranged to generate a reset signal in response to an output signal from the low voltage detector.

7. The integrated circuit of claim 6, further comprising a counter coupled to the reset controller for counting a number of times the integrated circuit is reset.

8. The integrated circuit of claim 3, further comprising a register for storing trim values.

9. The integrated circuit of claim 8, further comprising at least one level shifter for receiving a trim value stored in the register and for transferring said trim value to the latch arrangement.

10. The integrated circuit of claim 3, further comprising a flash memory for holding trim values.

11. The integrated circuit of claim 3, further comprising a fuse for holding trim values.

12. A method for preventing multiple resets in an integrated circuit device, wherein the integrated circuit device includes a power controller, the method comprising:

monitoring, in the power controller, a supply voltage level and comparing the supply voltage level with a reference voltage level;

generating an enable signal when the supply voltage level reaches a first reference voltage level and generating a clear signal when the supply voltage level drops below a second reference voltage level;

receiving a load trim value instruction from the integrated circuit device, wherein a trim value relates to at least one of a voltage regulator and a low voltage detector;

latching the trim value upon receipt of the instruction and a generated enable signal; and clearing the latched trim value upon receipt of a clear signal when the supply voltage level falls below the second reference voltage level.

13. The method of claim 12, further comprising generating, in the integrated circuit device, a load trim value instruction.

14. The method of claim 13, further comprising storing trim values in a trim register and latching the trim values from the trim register in a test mode of operation.

* * * * *